(12) United States Patent
Chan et al.

(10) Patent No.: US 10,141,405 B2
(45) Date of Patent: *Nov. 27, 2018

(54) LATERAL BIPOLAR JUNCTION TRANSISTOR WITH ABRUPT JUNCTION AND COMPOUND BURIED OXIDE

(71) Applicant: INTERNATIONAL BUSINESS MACHINES CORPORATION, Armonk, NY (US)

(72) Inventors: Kevin K. Chan, Staten Island, NY (US); Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/590,153

(22) Filed: May 9, 2017

(65) Prior Publication Data
US 2017/0301755 A1    Oct. 19, 2017

Related U.S. Application Data

(62) Division of application No. 15/097,548, filed on Apr. 13, 2016, now Pat. No. 9,673,307.

(51) Int. Cl.
*H01L 29/08* (2006.01)
*H01L 29/735* (2006.01)
(Continued)

(52) U.S. Cl.
CPC .... *H01L 29/0808* (2013.01); *H01L 21/02532* (2013.01); *H01L 21/02595* (2013.01);
(Continued)

(58) Field of Classification Search
CPC ............ H01L 29/0808; H01L 29/0623; H01L 27/735; H01L 21/02172; H01L 21/74;
(Continued)

(56) References Cited

U.S. PATENT DOCUMENTS 5,100,810 A * 3/1992 Yoshimi ............... H01L 21/764
                                                    148/DIG. 150
5,298,786 A * 3/1994 Shahidi ................. H01L 21/84
                                                    257/526

(Continued)

OTHER PUBLICATIONS

List of IBM Patents or Patent Applications Treated as Related dated May 9, 2017, 2 pages.
U.S. Office Action issued in U.S. Appl. No. 15/590,162, dated Mar. 15, 2018, pp. 1-24.
U.S. Office Action issued in U.S. Appl. No. 15/590,162, dated Oct. 30, 2017, pp. 1-19.

*Primary Examiner* — Bitew Dinke
(74) *Attorney, Agent, or Firm* — Tutunjian & Bitetto, P.C.; L. Jeffrey Kelly

(57) ABSTRACT

A lateral bipolar junction transistor (LBJT) device that may include a dielectric stack including a pedestal of a base region passivating dielectric and a nucleation dielectric layer; and a base region composed of a germanium containing material or a type III-V semiconductor material in contact with the pedestal of the base region passivating dielectric. An emitter region and collector region may be present on opposing sides of the base region contacting a sidewall of the pedestal of the base region passivating dielectric and an upper surface of the nucleation dielectric layer.

20 Claims, 5 Drawing Sheets

(51) Int. Cl.
*H01L 23/31* (2006.01)
*H01L 29/161* (2006.01)
*H01L 29/20* (2006.01)
*H01L 29/10* (2006.01)
*H01L 29/737* (2006.01)
*H01L 29/165* (2006.01)
*H01L 29/04* (2006.01)
*H01L 29/06* (2006.01)
*H01L 23/29* (2006.01)
*H01L 29/66* (2006.01)
*H01L 21/683* (2006.01)
*H01L 21/02* (2006.01)
*H01L 21/308* (2006.01)
*H01L 21/265* (2006.01)
*H01L 21/74* (2006.01)

(52) U.S. Cl.
CPC .. *H01L 21/26513* (2013.01); *H01L 21/26586* (2013.01); *H01L 21/3081* (2013.01); *H01L 21/6835* (2013.01); *H01L 23/291* (2013.01); *H01L 23/298* (2013.01); *H01L 23/3171* (2013.01); *H01L 29/04* (2013.01); *H01L 29/0623* (2013.01); *H01L 29/0649* (2013.01); *H01L 29/0821* (2013.01); *H01L 29/1008* (2013.01); *H01L 29/161* (2013.01); *H01L 29/165* (2013.01); *H01L 29/20* (2013.01); *H01L 29/6625* (2013.01); *H01L 29/66242* (2013.01); *H01L 29/735* (2013.01); *H01L 29/737* (2013.01); *H01L 21/02172* (2013.01); *H01L 21/02381* (2013.01); *H01L 21/74* (2013.01); *H01L 2221/6835* (2013.01)

(58) Field of Classification Search
CPC .......... H01L 21/02381; H01L 27/0262; H01L 27/14647; H01L 27/14652; H01L 29/6612; H01L 27/0647; H01L 27/067; H01L 27/0722
See application file for complete search history.

(56) References Cited

U.S. PATENT DOCUMENTS

| | | | | |
|---|---|---|---|---|
| 5,936,278 | A * | 8/1999 | Hu | H01L 29/1045 257/336 |
| 6,051,452 | A * | 4/2000 | Shigyo | H01L 21/84 257/E21.415 |
| 8,288,758 | B2 | 10/2012 | Ning et al. | |
| 8,420,493 | B2 | 4/2013 | Ning et al. | |
| 8,441,084 | B2 * | 5/2013 | Cai | H01L 29/737 257/183 |
| 9,059,016 | B1 * | 6/2015 | Hekmatshoar-Tabari | H01L 29/0804 |
| 9,318,585 | B1 * | 4/2016 | Cai | H01L 29/66242 |
| 9,536,788 | B1 * | 1/2017 | Ning | H01L 21/8228 |
| 9,673,307 | B1 * | 6/2017 | Chan | H01L 29/735 |
| 9,761,608 | B1 * | 9/2017 | Balakrishnan | H01L 27/1203 |
| 9,799,756 | B1 | 10/2017 | Chan et al. | |
| 9,852,938 | B1 * | 12/2017 | Chan | H01L 21/7624 |
| 2002/0089038 | A1 * | 7/2002 | Ning | H01L 27/1203 257/574 |
| 2003/0057491 | A1 | 3/2003 | Mitani et al. | |
| 2008/0135924 | A1 * | 6/2008 | Lebby | H01L 29/78603 257/327 |
| 2010/0213548 | A1 * | 8/2010 | Chang | H01L 21/823878 257/348 |
| 2012/0139009 | A1 * | 6/2012 | Ning | H01L 29/0808 257/197 |
| 2013/0256757 | A1 * | 10/2013 | Cai | H01L 29/42304 257/197 |
| 2014/0088401 | A1 * | 3/2014 | Cai | H01L 31/1105 600/407 |
| 2014/0354347 | A1 * | 12/2014 | Chi | G05F 3/30 327/478 |
| 2014/0357043 | A1 * | 12/2014 | Cai | H01L 29/66242 438/311 |
| 2015/0263091 | A1 * | 9/2015 | Hashemi | H01L 29/1008 257/191 |
| 2016/0380087 | A1 * | 12/2016 | Liu | H01L 21/28506 257/587 |
| 2018/0019330 | A1 * | 1/2018 | Balakrishnan | H01L 29/735 |
| 2018/0040723 | A1 * | 2/2018 | Chan | H01L 21/265 |

* cited by examiner

LATERAL BIPOLAR JUNCTION TRANSISTOR WITH ABRUPT JUNCTION AND COMPOUND BURIED OXIDE

BACKGROUND

Technical Field

The present disclosure relates to a bipolar junction transistor (BJT) structure, and more particularly to lateral bipolar junction transistors.

Description of the Related Art

Heterojunction bipolar junction transistors (HBTs) known in the art include a heterojunction, i.e., a junction of two semiconductor materials having different band gaps, that coincide with a p-n junction between the base and the emitter. The heterojunction at which two different semiconductor materials having different band gaps are joined coincide with the p-n junction. The wider band gap of the emitter relative to the band gap of the base in an HBT increases the current gain relative to a bipolar junction transistor employing a same semiconductor material across the base and the emitter and having similar physical dimensions and doping profiles for the base and emitter.

SUMMARY

In one aspect, the present disclosure provides a lateral bipolar junction transistor that includes a III-V semiconductor base or germanium containing base that is overlying a dielectric layer having passivation properties tailored for III-V or germanium containing semiconductors, and emitter and collector regions formed on an enhanced nucleation layer that is a separated the passivating dielectric. In one embodiment, the lateral bipolar junction transistor comprises a dielectric stack including a pedestal of a base region passivating dielectric and an nucleation dielectric layer. A base region comprised of a germanium containing material or a type III-V semiconductor material is in contact with the pedestal of the base region passivating dielectric. An emitter region and collector region is present on opposing sides of the base region contacting a sidewall of the pedestal of the base region and an upper surface of the nucleation dielectric layer.

In another embodiment, the lateral bipolar junction transistor (LBJT) device includes a pedestal of a base region passivating dielectric comprising zirconium oxide ($ZrO_2$), aluminum oxide ($Al_2O_3$), hafnium oxide ($HfO_2$), amorphous silicon ($\alpha$-Si) or a combination thereof; and a nucleation dielectric layer underlying the pedestal of the base region passivating dielectric. The nucleation dielectric layer may include cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$) or combinations thereof. In another example, the nucleation dielectric layer is silicon oxide or silicon nitride having doped silicon to increase the nucleation sites of the material. A base region composed of a germanium containing material or a type III-V semiconductor material is present in contact with the pedestal of the base region passivating dielectric. An emitter region and a collector region are present on opposing sides of the base region contacting a sidewall of the pedestal of the base region passivating dielectric and an upper surface of the nucleation dielectric layer.

In another aspect of the present disclosure, a method of forming a lateral bipolar junction transistor (LBJT) is disclosed that provides a III-V semiconductor base region or germanium containing base region that is overlying a dielectric layer having passivation properties tailored for III-V or germanium containing semiconductors, and emitter and collector regions formed on an enhanced nucleation layer that is a separated from the passivating dielectric. In one embodiment, the method includes forming a germanium containing or type III-V semiconductor material atop a substrate including a passivating layer overlying a nucleation dielectric layer, and patterning the germanium containing or type III-V semiconductor material and the passivating layer selectively to the nucleation dielectric layer to form a base region present overlying a pedestal of the passivating layer. Emitter extension region and collector extension region may be formed on opposing sides of the base region. An emitter region and collector region may be formed on exposed portions of the nucleation dielectric layer extending past the pedestal of the passivating layer into contact with the emitter and collector extension regions.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
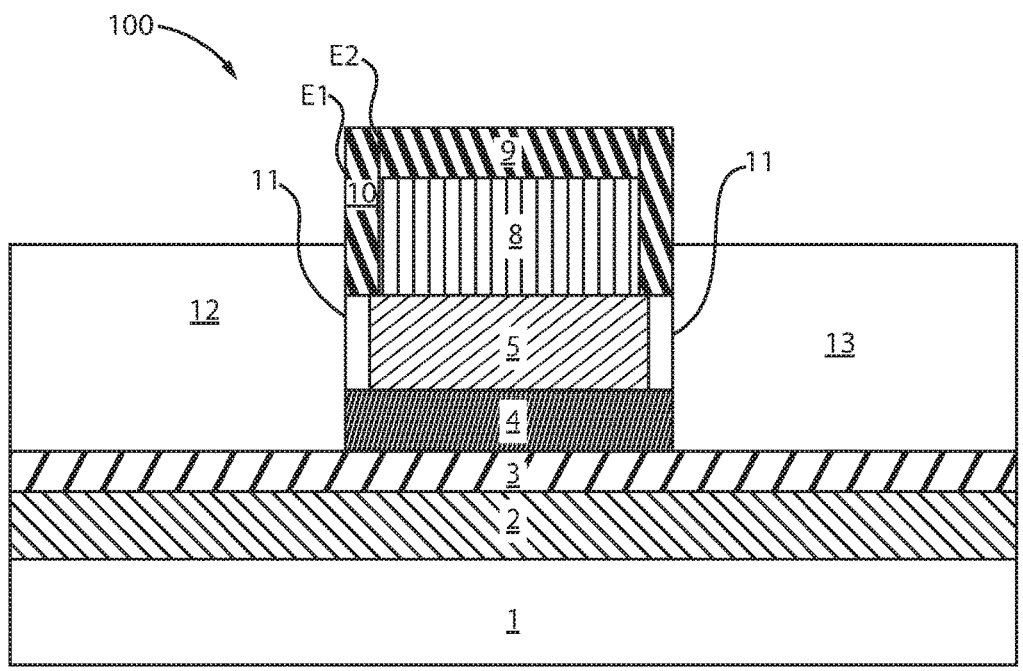
FIG. 1 is a side cross-sectional view of a lateral bipolar junction transistor (LBJT) device that includes a III-V semiconductor base or germanium containing base that is overlying a dielectric layer having passivation properties tailored for III-V or germanium containing semiconductors, and emitter and collector regions formed on an enhanced nucleation layer that is a separate dielectric layer from the passivating dielectric layer, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The term "bipolar junction transistor (BJT)" denotes is a semiconductor device formed by two P-N junctions whose function is amplification of an electric current. Bipolar transistors are made from 3 sections of semiconductor material, i.e., alternating P-type and N-type conductivity semiconductor materials, with two resulting P-N junctions. As will be described in greater detail below the (BJT) devices disclosed herein are lateral bipolar junction transistors (LBJT). The term "lateral" as used to describe a BJT device denotes that means that the dimension extending from the beginning of the emitter through the base to the collector is horizontally orientated or is parallel with the upper surface of the substrate in which the emitter/base/collector, i.e., NPN or PNP junction, is formed. The LBJT devices disclosed herein are composed of type III-V semiconductor materials or type IV semiconductor materials. The term "III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. In contrast to type III-V semiconductor materials, by "type IV semiconductor" it is meant that the semiconductor material includes at least one element from Group IVA (i.e., Group 14) of the Periodic Table of Elements. One example of a type IV semiconductor is germanium (Ge).

The present disclosure provides lateral bipolar junction transistors (LBJT), and methods of forming lateral bipolar junction transistor (LBJT) devices including germanium containing and III-V semiconductor materials. Germanium and III-V semiconductor materials are candidates for lateral bipolar junction transistors and can offer high cut off frequency for both NPN and PNP types. Additionally, in some applications, a lateral bipolar junction transistor (LBJT) device is required for high voltage applications. In some scenarios, controlling the collector/emitter (C/E) doping with ion implantation can be difficult due to depth control of the implantation, which usually results in non-uniform lateral and vertical dopant profiles.

It has been determined that in germanium (Ge) or III-V containing semiconductors the density of interface traps at the interface in contact with a common buried oxide region, such as $SiO_2$, is high and can affect device performance and base current. In some embodiments, the methods and structures that are disclosed herein can provide a low interface trap density with Ge or III-V semiconductor materials, abrupt junction control, and facilitate the emitter and collector regions formation through epitaxy/epitaxial growth or poly-nucleation. As will be described in further detail below, in some embodiments, the present disclosure provides a lateral BJT structure with Ge, SiGe or III-V base and a compound double or triple buried oxide region. For example, in one embodiment of the final structure of the LBJT, the upper buried oxide, i.e., first buried oxide, can be made of a dielectric stack (BOX1) for passivation properties suitable with Ge, SiGe or III-V. This layer may be referred to as a passivating dielectric throughout the disclosure. The final device structure may further include a second buried oxide composed of an enhanced nucleation dielectric that is in contact with the emitter and collector material, or poly-Ge, III-V, SiGe with higher bandgap in the E/C region. This layer may be referred to as a nucleation dielectric layer throughout the disclosure. In some embodiments, the final lateral bipolar junction transistor (LBJT) structure may further include a second buried oxide (BOX2) from starting substrate.

In some embodiments, a method of fabrication of lateral bipolar junction transistor (LBJT) is disclosed where base poly germanium or polysilicon germanium is deposited on the base semiconductor layer, and patterned. Spacers may then be formed, and the base semiconductor layer is etched through the first buried oxide layer (BOX1), stopping on nucleation enhanced dielectric. In a following process step, the emitter extension region and collector extension region are formed by ion-implant, e.g., angled ion implantation. The emitter and collector extension regions are formed from the patterned base semiconductor region by counter doping with angled ion-implantation. A semiconductor region having a doping concentration is counter doped when it is converted into a region of opposite conductivity type by introducing into it, e.g. by ion implantation, a dopant of opposite conductivity at a concentration larger than its doping concentration of the original conductivity type. The emitter/base junction of the final LBJT is located at the interface of the patterned base region and the emitter extension region, and the collector/base junction of the final LBJT is located at the interface of the patterned base region and the collector extension region. The emitter and collector regions may then be epitaxially grown nucleating from enhanced nucleation dielectric selective to spacer with opposite conductivity type and higher doping concentration relative to the base region. As will be described in greater detail below, the enhanced nucleation oxide, i.e., nucleation dielectric layer, can be composed of ion implanted silicon nitride, and/or a crystalline oxide, such as rare element oxides, e.g., $La_2O_3$ and/or $CeO_2$. The optional bottom buried oxide layer (BOX2), can be $SiO_2$, and the upper buried oxide layer (BOX1) can be $ZrO_2$, $Al_2O_3$, $HfO_2$, amorphous-Si or a combination thereof. The base should be made of a doped material that does not electrically add a barrier to the base material. Spacer should provide epi/poly selectivity and can be composed of a dielectric, such as an nitride, oxide, low-k dielectric, or combination thereof. The methods and structures of the present disclosure are now described with greater detail with reference to FIGS. 1-8.

FIG. 1 depicts one embodiment of an LBJT device 100 that includes a dielectric stack including a pedestal of a base region passivating dielectric material 4. The term "pedestal" denotes that the base region passivating dielectric material 4 has a lesser width than the underlying nucleation dielectric layer 3. In some embodiments, the base region passivating dielectric material 4 is composed of a material that passivates the base region's lower surface, i.e., reduces the density of interface traps that may form at the interface of the base region passivation dielectric material 4 and the base region 5. The base region 5 of the LBJT device 100 may be composed of a germanium containing or a type III-V semiconductor material. Typically, base regions or prior devices that are composed of germanium containing semiconductor materials or type III-V semiconductor materials that are in contact with conventional dielectrics, such as silicon oxide ($SiO_2$), suffer from a high interface trap density, which negatively impacts the device performance and base current. In some embodiments, the germanium containing or type III-V semiconductor material base region 5 of the LBJT device 100 provided by the present disclosure is passivated by a passivating dielectric material 4 that is selected for passivating type III-V and germanium containing semiconductor materials, which may have a composition that includes zirconium oxide ($ZrO_2$), aluminum oxide ($Al_2O_3$), hafnium oxide ($HfO_2$), amorphous silicon ($\alpha$-Si), magnesium oxide (MgO), silicon oxynitride (SiON) or a combination thereof. The pedestal of a base region passivating dielectric material 4 composed of the aforementioned materials can passivate a backside surface of a base region 5 composed of germanium containing semiconductor materials or type III-V semiconductor materials to reduce the trap density to a value substantially equal to or less than $5 \times 10^{12}$ cm$^{-2}$, which is less than previously possible with similar material layers using conventional oxides, such as silicon oxide ($SiO_2$). In some embodiments, the trap density is equal to $1 \times 10^{12}$ cm$^{-2}$ or less. In some further embodiments, the trap density is equal to $5 \times 10^{11}$ cm$^{-2}$ or less. The pedestal of a base region passivating dielectric material 4 may have a thickness ranging from 10 nm to 500 nm.

The base region 5 may be composed of any germanium containing or type III-V semiconductor material. Examples of germanium containing materials that are suitable for the base region 5 include germanium (Ge), e.g., single crystal germanium (c-Ge), and silicon germanium (SiGe), e.g., single crystal silicon germanium (c-SiGe). Examples of type III-V semiconductor materials suitable for the base region 5 may include aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAs), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

The base region 5 is the region within the lateral bipolar junction transistor (LBJT) where a sufficient input current triggers a larger current from the emitter 12 to the collector 13 of the transistor. The role of the base region 5 is to function as an amplifier causing an emitter-to-collector current to be much larger than the base current. When the base receives an input current, a larger current then flows from the emitter region 12 to the collector region 13. In a bipolar junction transistor, current flows from the emitter region 12 to the collector region 13 and then out from the collector region 13.

The base region 5 of the transistor has an opposite polarity, i.e., conductivity type, from the emitter region 12 and the collector region 13. The term "conductivity type" means that a region is either doped to an n-type conductivity or a p-type conductivity. For example, when the base region 5 is doped to an n-type conductivity, the emitter region 12 and the collector region 13 are doped to a p-type conductivity, and the transistor is referred to as a PNP bipolar transistor. In another example, when the base region 5 is doped to a p-type conductivity, the emitter region 12 and the collector region 13 are doped to an n-type conductivity, and the transistor is referred to as an NPN bipolar transistor.

The LBJT device 100 that is depicted in FIG. 1 further includes extension regions 11, with the emitter extension region being present between the emitter region 12 and the base region 5 on one side of the device, and the collector extension region between the base region 5 and the collector region 13 on the opposing side of the device. For example, each of the emitter extension region 11 and the collector extension region 11 may are substantially aligned with an outer edge E1 of an overlying spacer 10 and does not extend beyond an inner edge E2 of the spacer 10. The emitter extension region 11 and the collector extension region 11 may extend from the outer edge E1 towards the base 5 at an abrupt dopant concentration gradient of n-type or p-type dopants of 5 nm per decade or less, e.g., 4 nm per decade or less. That is, the emitter/base p-n junction and the collector/base p-n junction of the LBJT are abrupt p-n junctions.

The extension regions 11 typically have the same conductivity type as the corresponding emitter region 12 or collector region 13.

As will be further explained below, the extension regions 11 are provided by an angled ion implantation step following patterning of the pedestal of the passivation layer 4. Following formation of extension regions 11, the material layer for the emitter region 12 and the collector region 13 may be formed by epitaxial growth or poly-nucleation using a nucleation dielectric layer 3 as a growth surface.

Referring to FIG. 1, the nucleation dielectric layer 3 is positioned underlying the backside of the pedestal of the passivation material 4, e.g., in direct contact with the backside of the pedestal of the passivation material 4. The nucleation dielectric layer 3 has a width that extends beyond the edges of the pedestal of the passivation material 4 and provides the surfaces for forming the semiconductor material of the emitter region 12 and the collector region 13, which are positioned on opposing sides of the base region 5. In some embodiments, the nucleation dielectric layer includes silicon rich oxide or silicon rich nitride that provides silicon nuclei for emitter and collector epitaxial growth. In some embodiments, the nucleation dielectric layer 3 may be composed of an implanted nitride material, such as implanted silicon nitride, in which the implanted dopant is silicon. In other embodiments, the nucleation dielectric layer 3 may be composed of a crystalline oxide, such a rare earth oxide, e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$) or combinations thereof. The nucleation dielectric layer 3 may have a thickness ranging from 1 nm to 100 nm.

Still referring to FIG. 1, an emitter region and collector region 12, 13 may be present on opposing sides of the base region 5 contacting a sidewall of the pedestal of the base region passivating dielectric 4 and an upper surface of the nucleation dielectric layer 3. The emitter region 12 and collector region 13 may be composed of polycrystalline germanium, polycrystalline silicon germanium, single crystalline germanium or single crystalline silicon germanium. In some other embodiments, the emitter region 12 and the collector region 13 may also be composed of a type III-V semiconductor. For example, the emitter region 12 and the collector region 13 may each include at least one of gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof.

The material that is selected for the semiconductor material of the emitter region 12 and the collector region 13 may have a larger band gap than the base region 5. The term "band gap" refers to the energy difference between the top of the valence band (i.e., EV) and the bottom of the conduction band (i.e., EC). For example, in some embodiments, to provide that the emitter and collector region 12, 13 have a larger band gap than the base region, when the base region 5 is composed of p-type doped germanium (Ge), the emitter and collector regions 12, 13 may be composed of n-type doped silicon germanium (SiGe).

Still referring to FIG. 1, the LBJT device 100 may further include an extrinsic base region 8 that is present atop the base region 5. The extrinsic base region 8 is typically formed of a germanium containing semiconductor material, such as polycrystalline germanium, polycrystalline silicon germanium, single crystal germanium, single crystal silicon germanium and combinations thereof. In other embodiments, the extrinsic base region 8 may be composed of a type III-V semiconductor material. Examples of III-V semiconductor materials suitable for the extrinsic base 8 include indium aluminum arsenic (InAlAs), indium gallium arsenide (InGaAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof. The extrinsic base region 8 is typically doped to a same conductivity type as the base region 5. For example, if the base region 5 is doped to an n-type conductivity, the extrinsic base region 8 is also doped to an n-type conductivity. The dopant concentration of the dopant that dictates the conductivity type of the extrinsic base region 8 is typically greater than the dopant concentration that dictates the conductivity type of the base region 5. For example, the dopant concentration of the n-type or p-type dopant in the extrinsic base region 8 may range from $4 \times 10^{19}$ atoms/cm$^3$ to $6 \times 10^{21}$ atoms/cm$^3$. In another example, the dopant concentration of the n-type or p-type dopant in the extrinsic base region 8 may range from $1 \times 10^{20}$ atoms/cm$^3$ to $1 \times 10^{21}$ atoms/cm$^3$. The extrinsic base region 8 is present within the width of the base region 5.

Spacers 10 of a dielectric material, such as an oxide, nitride, oxynitride material or low-k dielectric material, are present on the sidewalls of the extrinsic base region 8. Examples of materials suitable for low-k dielectric spacers 10 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. A hard mask 9 may be present atop the extrinsic base region 5, and may be composed of an oxide, nitride or oxynitride material. For example, the hard mask 9 can be composed of silicon nitride.

The LBJT device that is depicted in FIG. 1 may be present on a semiconductor substrate 1 composed of a type III-V semiconductor material or type IV semiconductor material. The semiconductor substrate 1 is typically composed of a single crystalline material. Examples of type IV semiconductor materials for the semiconductor substrate 1 include silicon (Si), germanium (Ge) and silicon germanium (Ge). The semiconductor substrate 1 may also be composed of indium phosphide (InP) or indium phosphide (InP) on silicon (Si). Other III-V semiconductor materials that can provide the semiconductor substrate may include indium aluminum arsenic (InAlAs), indium gallium arsenide (InGaAs), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), and combinations thereof.

In some embodiments, an optional buried oxide layer 2, such as a buried oxide layer composed of silicon oxide ($SiO_2$), may be present between the semiconductor substrate 1 and the nucleation dielectric layer 3. The optional buried oxide layer 2 may have a thickness ranging from 20 nm to 200 nm.

Figure 2:
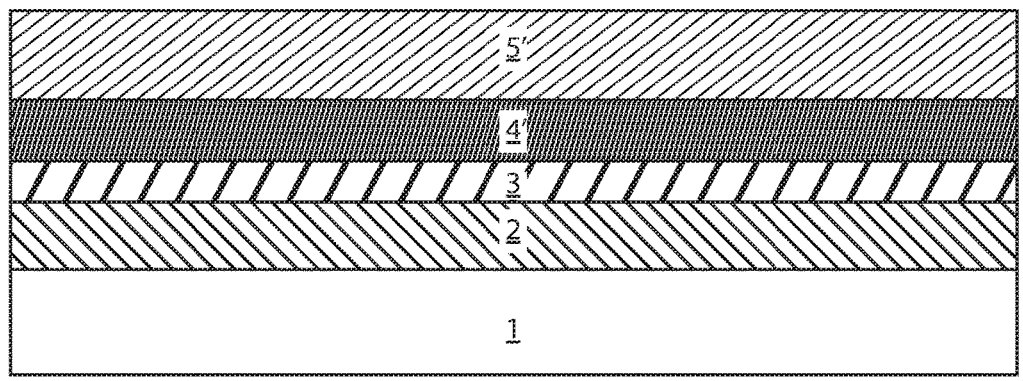
FIG. 2 is a side cross-sectional view depicting one embodiment of a substrate structure that may be used to form a lateral bipolar junction transistor (LBJT) that includes a material stack of a germanium containing or type III-V semiconductor material, a passivating layer and a nucleation dielectric layer, in accordance with one embodiment of the present disclosure.

FIGS. 2-8 depict one embodiment of a method for forming the LBJT devices 100 depicted in FIG. 1. FIG. 2 depicts one embodiment of an initial structure for forming a lateral bipolar junction transistor (LBJT). FIG. 2 depicts one embodiment of a substrate structure that includes a material stack of a germanium containing or type III-V semiconductor material 5', a passivating layer 4' and a nucleation dielectric layer 3. In some embodiments, a buried oxide (BOX) layer 2 may be present underlying the nucleation dielectric layer 3, where the buried oxide layer 2 separates a base semiconductor substrate 1 from the nucleation dielectric layer 3. As will be described below, the germanium containing or type III-V semiconductor material layer 5' provides the base region 5 of the LBJT device, and the passivating layer 4' provides the pedestal of the passivating dielectric material 4, as depicted in FIG. 1.

Therefore, the above description of the composition for the base region 5 depicted in FIG. 1 is suitable for describing at least one example of the germanium containing or type III-V semiconductor material layer 5' that is depicted in FIG. 2, and the above description of the composition for the pedestal of the passivation layer 4 depicted in FIG. 1 is suitable for describing the passivating layer 4' depicted in FIG. 2. Similarly, the nucleation dielectric layer 3, the buried oxide layer 2 and the base semiconductor substrate 1 that are depicted in FIG. 2 have been described above with reference to FIG. 1.

Figure 3C:
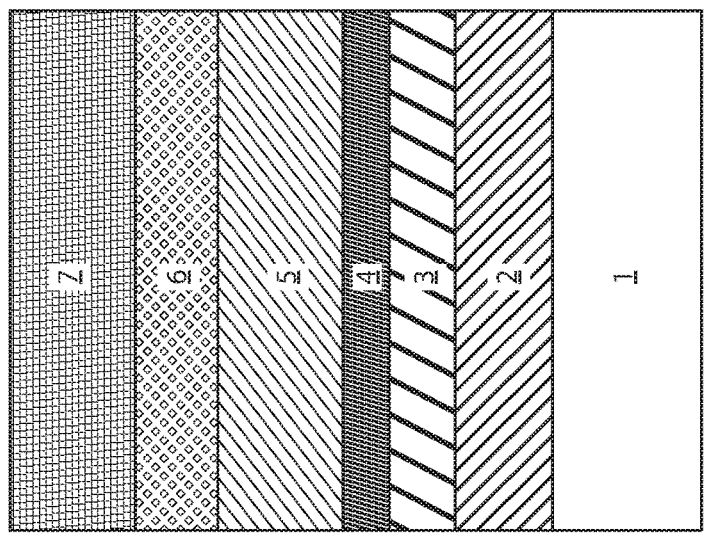
FIG. 3C is a side cross-sectional view depicting bonding the first substrate component depicted in FIG. 3A to the second substrate component depicted in FIG. 3B, in accordance with one embodiment of the present disclosure.
Figure 3B:
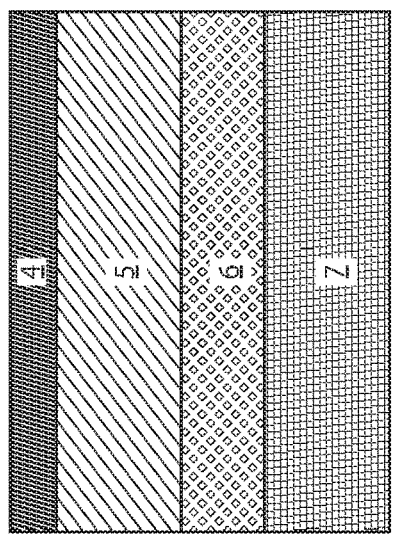
FIG. 3B is a side cross-sectional view of a second substrate component for use with the first substrate component depicted in FIG. 3A for forming the substrate structure depicted in FIG. 2 by bonding techniques, in accordance with one embodiment of the present disclosure.
Figure 3A:
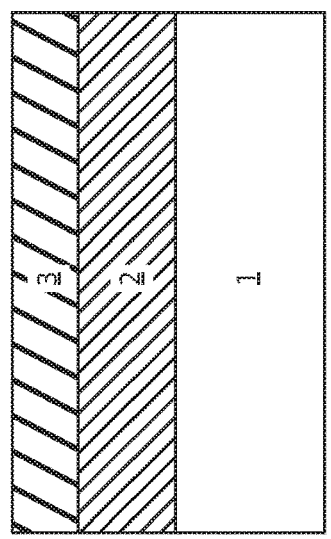
FIG. 3A is a side cross-sectional view of one substrate component for use in forming the substrate structure depicted in FIG. 2 using bonding methods, in accordance with one embodiment of the present disclosure.

The substrate structure depicted in FIG. 2 may be formed using bonding methods, such as the bonding sequence depicted in FIGS. 3A-3C. FIG. 3A depicts one embodiment of a first substrate component for use in forming the substrate structure depicted in FIG. 2 using bonding methods. The first substrate component may include a material stack that includes the base semiconductor substrate 1, the buried oxide layer 2 present on the semiconductor substrate 1, and the nucleation dielectric layer 3 present atop the buried oxide layer 2.

The buried oxide layer 2 may be formed on the base semiconductor substrate 1 using a deposition method, such as chemical vapor deposition, e.g., plasma enhanced chemical vapor deposition (PECVD), or may be formed using a thermal growth process, e.g., thermal oxidation. The nucleation dielectric layer 3 may be formed on the buried oxide layer 2 using chemical vapor deposition. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof. The nucleation dielectric layer 3 may be composed of composition including a rare earth metal and oxygen. In some embodiments, the rare earth metal of the nucleation dielectric layer 3 is selected from the group consisting of Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), Luthium (Lu), and a combination thereof. Exemplary materials suitable for the nucleation dielectric layer 3 include rare earth oxides (e.g., cerium oxide ($CeO_2$), lanthanum oxide ($La_2O_3$), yttrium oxide ($Y_2O_3$), gadolinium oxide ($Gd_2O_3$), europium oxide ($Eu_2O_3$), and terbium oxide ($Tb_2O_3$). In some embodiments, the nucleation dielectric layer 3 includes combinations of rare earth oxides (e.g., a material such as $ABO_3$, where 'A' and 'B' may be any rare earth metal (e.g., lanthanum scandium oxide ($LaScO_3$)). In yet another embodiment, nucleation dielectric layer 3 may include aluminum oxide $Al_2O_3$ or aluminum oxide compounds (e.g., lanthanum aluminum $LaAlO_3$). In some examples, the nucleation dielectric layer 3 is selected from the group consisting of ($La_xY_{1-x})_2O_3$, $CeO_2$, and combinations thereof.

FIG. 3B depicts one embodiment of a second substrate component for use with the first substrate component depicted in FIG. 3A for forming the substrate structure depicted in FIG. 2 through bonding techniques. The second substrate component may include a handling substrate 7, a sacrificial buried oxide layer 6, the germanium containing or type III-V semiconductor material layer 5' that provides the base region 5, and the passivating layer 4' that provides the pedestal of the passivation layer 4. The handling substrate 7 may be composed of any material that can support the aforementioned material stack as part of the bonding process during the method for forming the structure depicted in FIG. 2, which may include dielectric, semiconductor or metal materials. For example, the handling substrate 7 may be composed of silicon (Si). The sacrificial buried oxide layer 6 may be deposited on the handling substrate 7 using a chemical vapor deposition (CVD) process. In some examples, the sacrificial buried oxide layer 6 may be composed of silicon oxide ($SiO_2$). The germanium containing or type III-V semiconductor material layer 5' may be formed on the sacrificial buried oxide layer 6 using a deposition process, such as chemical vapor deposition (CVD), e.g., plasma enhanced chemical vapor deposition (PECVD), or the germanium containing or type III-V semiconductor material layer 5' may be transferred to the surface of the sacrificial buried oxide layer 6 using bonding techniques and layer transfer techniques.

Because the germanium containing or type III-V semiconductor material layer 5' is processed to provide the base region 5 of the lateral bipolar junction transistor (LBJT) device, the germanium containing or type III-V semiconductor material layer 5' is doped to an n-type or p-type conductivity depending upon whether the LBJT device is a PNP or an NPN device. The dopant that dictates the conductivity type of the germanium containing or type III-V semiconductor material layer 5' may be introduced using ion implantation or in situ doping. The term "in situ" denotes that the dopant that dictates the conductivity type of a material is introduced while the material is being formed, e.g., during an epitaxial growth process.

FIG. 3C depicts bonding the first substrate component depicted in FIG. 3A to the second substrate component depicted in FIG. 3B. More specifically, in one embodiment, the exposed surface of the passivation layer 4' from the second substrate component is contacted to the exposed surface of the nucleation dielectric layer 3 of the first substrate component under temperature and pressure to form a thermal bond that connects the first substrate component to the second substrate component. In other embodiments, adhesive bonding may be used to engage the exposed surface of the passivation layer 4' from the second substrate component is contacted to the exposed surface of the nucleation dielectric layer 3 of the first substrate component to provide the structure depicted in FIG. 3C. Following bonding, the handling substrate 7 and the sacrificial buried oxide layer 6 may be removed using selective etching, e.g., reactive ion etch, plasma etching or planarization, e.g., chemical mechanical planarization, to provide the substrate structure depicted in FIG. 2.

Figure 4:
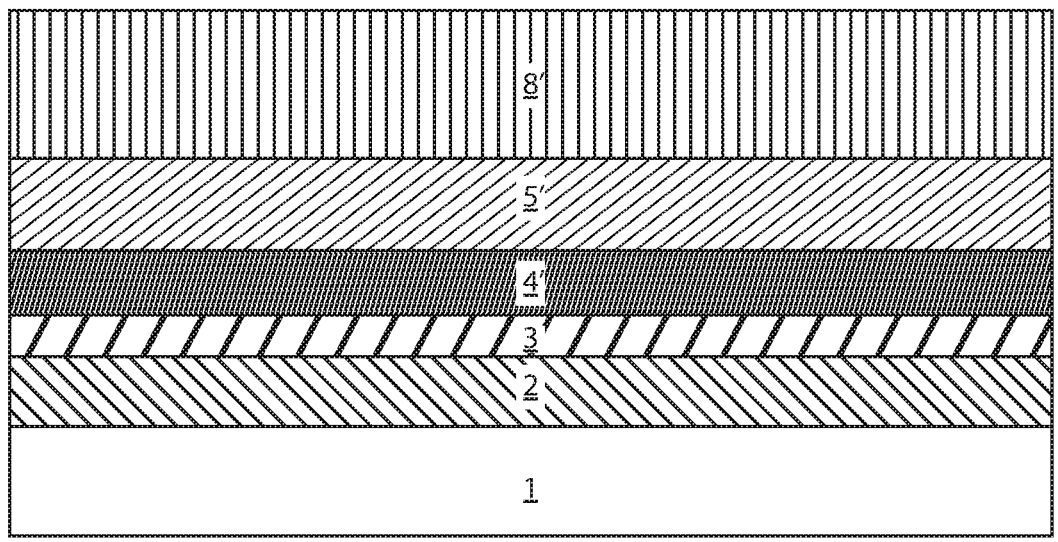
FIG. 4 is a side cross-sectional view depicting forming a material layer for an extrinsic base region of the lateral bipolar junction transistor (LBJT) device on the substrate depicted in FIG. 2, wherein the extrinsic base region includes doped polycrystalline silicon germanium (SiGe) or doped polycrystalline germanium (Ge), in accordance with one embodiment of the present disclosure.

FIG. 4 depicts one embodiment of forming a material layer 8' for an extrinsic base region 8 of the LBJT device on the substrate depicted in FIG. 2, wherein the extrinsic base region 8 may be composed of doped polycrystalline silicon germanium (SiGe), doped polycrystalline germanium (Ge), or doped polycrystalline silicon (Si). In some embodiments, F=for germanium containing semiconductor materials 5', Si is an acceptable option for the extrinsic base region 8. The material layer 8' for an extrinsic base region 8 is typically formed atop the germanium containing or type III-V semiconductor material 5'. The material layer 8' for the extrinsic base region 8 may be formed using chemical vapor deposition (CVD). Variations of CVD processes suitable for this stage of the process flow disclosed herein may include, but is not limited to, Atmospheric Pressure CVD (APCVD), Low Pressure CVD (LPCVD), Plasma Enhanced CVD (PECVD), Metal-Organic CVD (MOCVD) and combinations thereof. The material layer 8' for an extrinsic base region 8 of the LBJT device is typically doped to the same conductivity type as the germanium containing or type III-V semiconductor material 5', but the concentration of the n-type or p-type dopant that is present in the material layer 8' for an extrinsic base region 8 is typically greater than the dopant concentration of the n-type or p-type dopant in the germanium containing or type III-V semiconductor material 5' that provides the base region 5 of the LBJT. In one example, when the concentration of the n-type or p-type dopant in the base region 5 ranges from $1 \times 10^{17}$ atoms/cm$^3$ to $3 \times 10^{19}$ atoms/cm$^3$, the concentration of the n-type or p-type dopant in material layer 8' for an extrinsic base region 8 may range from $1 \times 10^{19}$ atoms/cm$^3$ to $5 \times 10^{21}$ atoms/cm$^3$. In another example, when the concentration of the n-type or p-type dopant in the base region 5 ranges from $1 \times 10^{18}$ atoms/cm$^3$ to $5 \times 10^{18}$ atoms/cm$^3$, the concentration of the n-type or p-type dopant in material layer 8' for an extrinsic base region 8 may range from $1 \times 10^{20}$ atoms/cm$^3$ to $1 \times 10^{21}$ atoms/cm$^3$. The dopant may be implanted in situ, by ion implantation, or by gas phase doping. The thickness for the material layer 8' for an extrinsic base region 8 of the LBJT device may range from 5 nm to 1000 nm.

Figure 5:
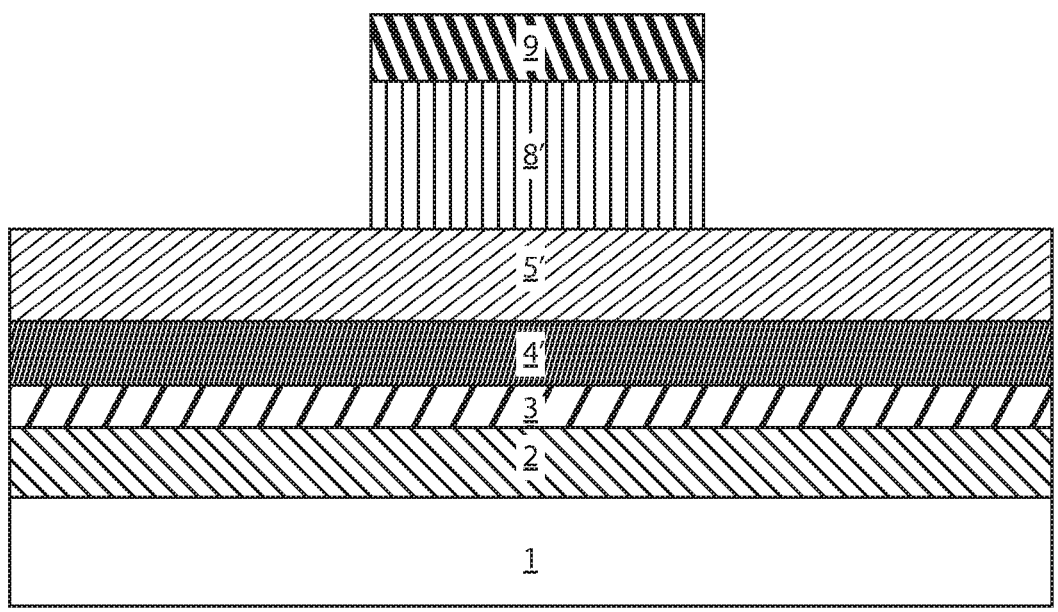
FIG. 5 is a side cross-sectional view depicting forming a hardmask on the material layer for the extrinsic base region of the LBJT device, and patterning the material layer for the extrinsic base region of the LBJT device, in accordance with one embodiment of the present disclosure.

FIG. 5 depicts one embodiment of forming a hardmask 9 on the material layer 8' for the extrinsic base region 8 of the LBJT device, and patterning the material layer 8' to provide the extrinsic base region 8 of the LBJT device. Forming a hardmask 9 may begin with depositing a dielectric layer on the upper surface of the material layer 8' for the extrinsic base region 8. The dielectric layer that provides the hardmask 9 may be composed of an oxide, nitride, oxynitride, metal oxide or combination thereof. For example, when the hardmask 9 is composed of a nitride, the nitride may be provided by silicon nitride. The material layer for the hardmask 9 may be blanket deposited using chemical vapor deposition, e.g., plasma enhanced chemical vapor deposition (PECVD). The dielectric layer may then be patterned using photolithography and etch process, which can begin with forming a photoresist block mask. A photoresist block mask can be produced by applying a photoresist layer, exposing the photoresist layer to a pattern of radiation, and then developing the pattern into the photoresist layer utilizing conventional resist developer. The portions of the dielectric layer that are protected by the photoresist block mask remain to provide the hardmask 9, and the portions of the dielectric layer that are not protected by the photoresist block mask are removed by an etch process. The etch process for removing the exposed portions of the dielectric layer in patterning the hardmask 9 may be an anisotropic etch, such as reactive ion etch or laser etch, or an isotropic etch, such as a wet chemical etch.

Following formation of the hard mask 9, the exposed portions of the material layer 8' for the extrinsic base region 8 may be etched, i.e., removed, to expose an upper surface of the underlying germanium containing or type III-V semiconductor material 5' for the base region 5. In one embodiment, the etch process for etching the material layer 8' for the extrinsic base region 8 may be an anisotropic etch. An "anisotropic etch process" denotes a material removal process in which the etch rate in the direction normal to the surface to be etched is greater than in the direction parallel to the surface to be etched. One form of anisotropic etching that is suitable for etching the material layer 8' for the extrinsic base region 8 is reactive ion etching (RIE). The etch process may be timed until the upper surface of the underlying germanium containing or type III-V semiconductor material 5' for the base region 5 is exposed.

Figure 6:
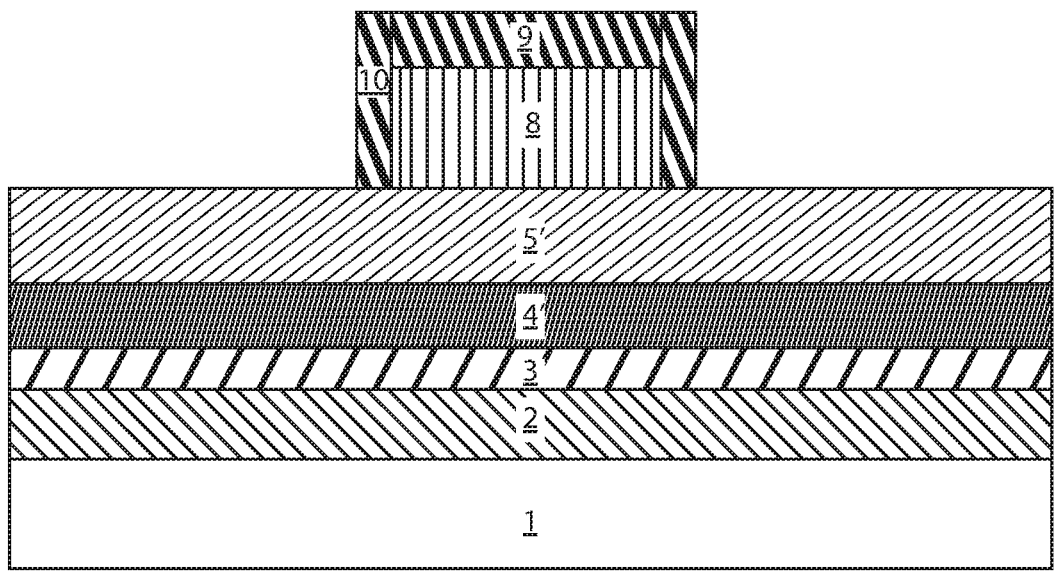
FIG. 6 is a side cross-sectional view depicting forming a spacer on the extrinsic base region, in accordance with one embodiment of the present disclosure.

FIG. 6 depicts one embodiment of forming a spacer 10 on the sidewalls of the extrinsic base region 8. The spacer 10 may include a dielectric material such as silicon oxide, silicon nitride, silicon oxynitride, organosilicate glass, or a combination thereof. The spacer 10 can be formed, for example, by conformal deposition of a dielectric material layer and subsequent anisotropic etch that removes the horizontal portions of the deposited dielectric material layer. The term "conformal layer" denotes a layer having a thickness that does not deviate from greater than or less than 30% of an average value for the thickness of the layer. The conformal deposition of the dielectric material layer can be performed, for example, by chemical vapor deposition (CVD), atomic layer deposition (ALD), or a combination thereof. The etch process may be reactive ion etching (RIE) or laser etching.

Figure 7:
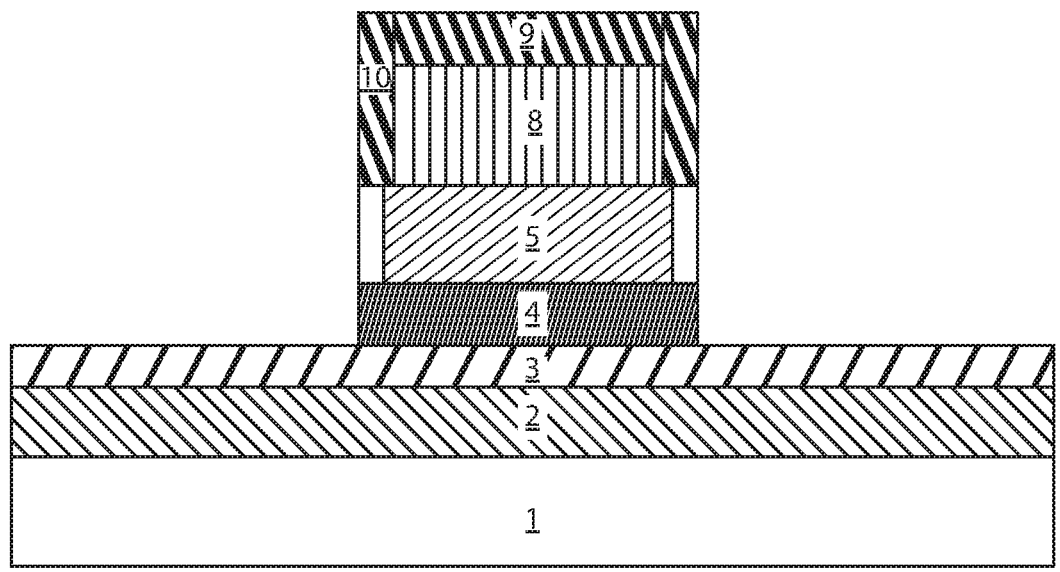
FIG. 7 is a side cross-sectional view depicted etching the germanium containing or type III-V semiconductor material for providing a base region for the lateral bipolar junction transistor (LBJT) device, and the etching the passivating layer selectively to the nucleation dielectric layer, in accordance with one embodiment of the present disclosure.

FIG. 7 depicts etching the germanium containing or type III-V semiconductor material 5' for providing a base region 5 for the LBJT device, and the etching the underlying passivating layer 4' selectively to the nucleation dielectric layer 3. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 100:1 or greater.

The etch process depicted in FIG. 7 patterns the base region 5 from the germanium containing or type III-V semiconductor material 5'. The exposed portions of the germanium containing or type III-V semiconductor material 5' may be removed while the portions of the germanium containing or type III-V semiconductor material 5' underlying the spacer 10, and the hardmask 9 are protected from being removed by the etch. The etch process for removing the exposed portions of the germanium containing or type III-V semiconductor material 5' may be a wet etch or a dry etch, such as reactive ion etch. The etch process for etching the germanium containing or type III-V semiconductor material 5' may be selective to the dielectric spacer 10, the hardmask 9 and the underlying passivating dielectric layer 4'. In this example, one the underlying passivation dielectric layer 4' is exposed a second etch composition may be utilized to provide the pedestal of the passivating dielectric 4. The second etch chemistry may remove the exposed portions of the passivating dielectric layer 4' selectively to the nucleation dielectric layer 3. This is one example of a two stage etch process. In another embodiment, a single etch chemistry may be used to pattern both the base region 5 and the pedestal of the passivating dielectric 4, in which the etch process is selective to the dielectric spacer 10, the hardmask 9 and the underlying nucleation dielectric layer 3.

Figure 8:
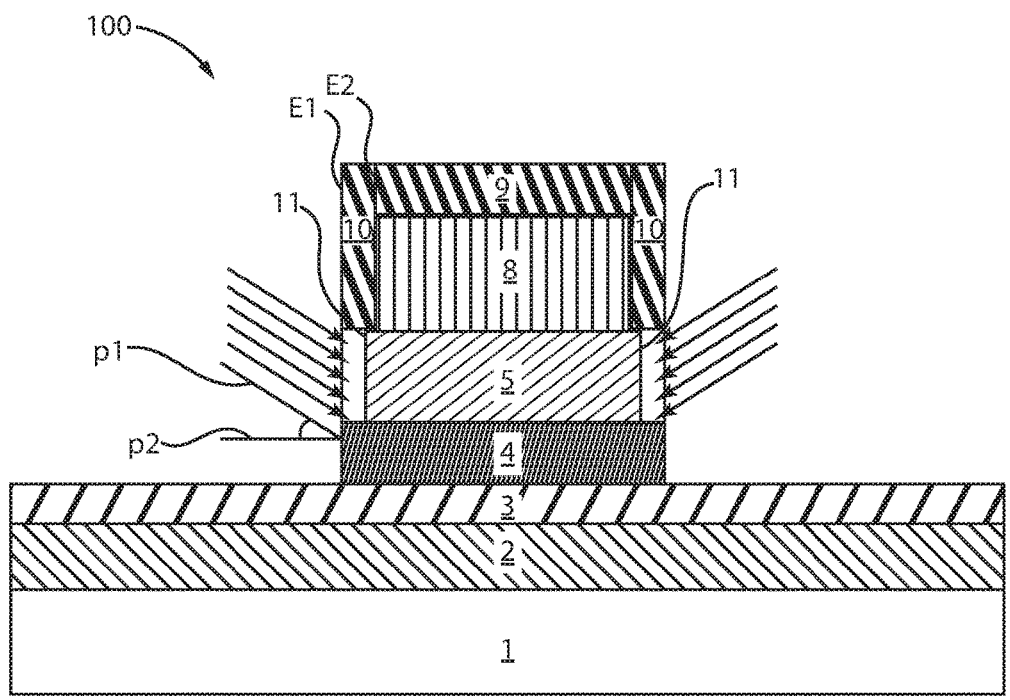
FIG. 8 is a side cross-sectional view depicting one embodiment of forming emitter and collector extension regions on opposing sides of the base region, in accordance with one embodiment of the present disclosure.

FIG. 8 depicts one embodiment of forming emitter and collector extension regions 11, e.g., abrupt extension regions 11, on opposing sides of the base region 5. The emitter and collector extension regions 11, i.e., the emitter and collector p-n junctions with the base region 5, may be formed using an angled ion implant and an anneal process. The extension regions 11 are doped to a conductivity type that is opposite the conductivity type of the base region 5. For example, if the base region 5 has an n-type conductivity, the extension regions 11 are doped to a p-type conductivity. In another example, if the base region 5 has a p-type conductivity, the extension regions 11 are doped to an n-type conductivity.

The term "p-type" refers to the addition of impurities to an intrinsic semiconductor that creates deficiencies of valence electrons. As used herein, "n-type" refers to the addition of impurities that contributes free electrons to an intrinsic semiconductor. In the embodiments, in which the base region 5 is composed of a type IV semiconductor material, such as germanium (Ge) or silicon germanium (SiGe), examples of n-type dopants may include antimony, arsenic and phosphorous, and examples of p-type dopants may include boron, aluminum, gallium and indium. To provide an n-type dopant to the III-V semiconductor material, the dopant may be an element from Group IV or VI of the Periodic Table of Elements. To provide a p-type dopant to the III-V semiconductor material, the dopant may be an element from Group II or VI of the Periodic Table of Elements. In an III-V semiconductor, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities. In some examples, to provide abrupt junctions in a base region 5 composed of a type III-V semiconductor material, the dopants that dictate the n-type or p-type conductivity may include silicon (Si), iron (Fe), germanium (Ge) and combinations thereof.

The dopants for the emitter and collector extension regions 11, e.g., abrupt extension regions 11, are introduced by angled ion implantation, and extend beneath the outside edge E1 of the spacer 10, but not extend in a significant amount, i.e., concentration, beyond the outside edge E2 of the spacer 10. Angled ion implantation as used throughout the instant application denotes that dopants are implanted towards the surface of the exposed sidewall surface of the base region 5 along a plane P1 that forms an acute angle α when intersecting with the plane P2 that is substantially parallel to the upper surface of the passivating dielectric layer 4. The angled ion implantation may include an angle α ranging from 3° to 75°. In another embodiment, the angled ion implantation includes an angle α ranging from 5° to 60°. In yet another embodiment, the angled ion implantation includes an angle α ranging from 15° to 45°.

Following the angled ion implantation, the structure may be annealed with a low temperature junction anneal. The anneal may be conducted by furnace, rapid thermal anneal (RTA) or laser anneal. The temperature of the anneal process may range from 400° C. to 600° C., in which the time and temperature of the anneal is selected to avoid excess diffusion of the dopant from the extension regions 11 with the base region 5, so as to maintain the abrupt characterization of the dopant distribution in the extension regions 11.

In a following process step, the emitter and collector regions 12, 13 of the LBJT device are formed by epitaxial deposition or poly-nucleation to provide the structure depicted in FIG. 1. The emitter and collector regions 12, 13 are typically composed of polycrystalline or single crystalline semiconductor material having a larger band gap than the base region. The term "single crystalline" denotes a crystalline solid, in which the crystal lattice of the entire sample is substantially continuous and substantially unbroken to the edges of the sample, with substantially no grain boundaries. Contrary to a single crystal crystalline structure, a polycrystalline structure is a form of semiconductor material made up of randomly oriented crystallites and containing large-angle grain boundaries, twin boundaries or both. Multi-crystalline is widely referred to a polycrystalline material with large grains (of the order of millimeters to centimeters). Other terms used are large-grain polycrystalline, or large-grain multi-crystalline. The term polycrystalline typically refers to small grains (hundreds of nanometers, to hundreds of microns).

The single crystalline or polycrystalline semiconductor material that provides the emitter region 12 and the collector region 13 may be a type IV semiconductor material, such as germanium (Ge), silicon germanium (Ge), or silicon (Si). Silicon is acceptable semiconductor material for the emitter and collector region 12, 13 in devices including a germanium-containing base 5. In other embodiments, the single crystalline or polycrystalline semiconductor material that provides the emitter region 12 and the collector region 13 may be a type III-V semiconductor, such as indium gallium arsenide (InGaAs). Typically, in some embodiments, when the base region is composed of a III-V semiconductor material, the emitter region 12 and collector region 13 are also composed of a III-V semiconductor material, and the band gap of the emitter and collector region 12, 13 can be equal to or larger than the band gap of the base region 5. The composition of the semiconductor material that provides the emitter region 12 and the collector region 13 may be selected to have a band gap that is equal to or greater than the base region 5. For example, when the base region 5 is composed of germanium (Ge) that is p-type doped, the emitter and collector region 12, 13 may be composed of n-type silicon germanium (SiGe), in which silicon germanium (SiGe) has a greater band gap than germanium (Ge).

The polycrystalline or single crystalline semiconductor material is grown, e.g., by epitaxial grown or poly-nucleation, on the nucleation dielectric layer 3. The growth method for forming the polycrystalline or single crystalline semiconductor material of the emitter region 12 and collector region 13 may use the nucleation dielectric layer 3 as a growth surface. For example, to provide a single crystalline material, the semiconductor material may be formed using epitaxial growth, in which the crystalline oxide surface of the nucleation dielectric layer 3 can impact the crystalline nature of the deposited semiconductor material for the emitter and collector regions 12, 13.

"Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus. The temperature for epitaxial deposition typically ranges from 550° C. to 900° C.

Although higher temperature typically results in faster deposition, the faster deposition may result in crystal defects and film cracking.

Deposition by poly-nucleation may provide polycrystalline semiconductor material, such as poly-germanium (poly-Ge) and poly-silicon germanium (poly-SiGe). Deposition by poly-nucleation may include chemical vapor deposition (CVD). Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof.

A number of different sources may be used for the deposition of the semiconductor material for the emitter and collector region 12, 13. In some embodiments, in which the emitter and collector region are composed of germanium, the germanium gas source may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material that forms the emitter and collector regions 12, 13 is composed of silicon germanium, the silicon sources for deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

In some embodiments, the deposition process for forming the semiconductor material of the emitter and collector regions 12, 13 may continue until the thickness of the deposited material extends above the upper surface of the base region 5.

The emitter and collector regions 12, 13 are doped with a conductivity type dopant that is opposite the conductivity type of the base region 5. The emitter and collector regions 12, 13 are doped with a conductivity type dopant that is the same conductivity type as the emitter and collector extension regions 11, e.g., abrupt junctions 11. The dopant concentration of the epitaxially formed in-situ doped single crystal III-V semiconductor material that provides the emitter and collector regions 12, 13 is less than the dopant concentration of the emitter and collector extension regions 11. In one example, the dopant concentration of the emitter and collector regions 12, 13 may range from $5\times10^{19}$ atoms/$cm^3$ to $1\times10^{21}$ atoms/$cm^3$. In another example, the dopant concentration of the emitter and collector regions 12, 13 may range from $2\times10^{19}$ atoms/$cm^3$ to $5\times10^{19}$ atoms/$cm^3$.

Having described preferred embodiments of lateral bipolar junction transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a lateral bipolar junction transistor (LBJT) comprising:
    providing a germanium containing material on a nucleation dielectric layer with a bonding method;
    patterning the germanium containing material selectively to the nucleation dielectric layer to form a base region present overlying a pedestal of the passivating layer;
    forming emitter and collector extension regions on opposing sides of the base region; and
    forming an emitter region and collector region on exposed portions of the nucleation dielectric layer extending into contact with the emitter and collector extension regions.

2. The method of claim 1, wherein said providing the germanium containing material on the nucleation dielectric layer with the bonding method comprises:
    forming a first material stack comprising a nucleation dielectric layer, wherein the second material stack further comprises a buried oxide region separating the nucleation dielectric layer from a supporting substrate;
    forming a second material stack comprising a passivating layer on said germanium containing or type III-V semiconductor material on said passivating layer, wherein the first material stack further comprises a sacrificial oxide layer separating said germanium containing material from a handling substrate;
    bonding the first material stack to the second material stack through contact between the nucleation dielectric layer and the passivating layer; and
    removing the handling substrate and the sacrificial oxide layer.

3. The method of claim 1 further comprising:
    forming an extrinsic base material layer comprising a doped polycrystalline silicon material, doped polycrystalline germanium containing material or a doped single crystalline germanium containing material on the germanium containing semiconductor base material;
    forming a hard mask on the extrinsic base material layer;
    etching the extrinsic base material layer selective to the hard mask and the germanium containing semiconductor base material to pattern an extrinsic base region;
    forming a spacer on the sidewalls of said extrinsic base region; and
    etching the germanium containing semiconductor base material to pattern the base region with an etch that is selective to the hard mask and the spacer prior to said forming emitter and collector extension regions.

4. The method of claim 3, wherein said forming emitter and collector extension regions comprises performing an angled ion implantation to produce an emitter and collector junction on opposing sides of the base region.

5. The method of claim 4, wherein the emitter region and collector region comprise polycrystalline material that is grown on the nucleation dielectric layer.

6. The method of claim 4, wherein the emitter region and collector region comprise single crystalline semiconductor material that is grown on the nucleation dielectric layer.

7. The method of claim 4, wherein the nucleation dielectric layer is selected from the group consisting of cerium oxide (CeO2), lanthanum oxide (La2O3), yttrium oxide (Y2O3), gadolinium oxide (Gd2O3), europium oxide (Eu2O3), terbium oxide (Tb2O3), doped silicon nitride and combinations thereof.

8. The method of claim 4, wherein the nucleation dielectric layer comprises silicon nitride or silicon oxide including implanted silicon to include nucleation sites.

9. The method of claim 4, wherein the emitter region and the collector region comprise semiconductor material having a larger band gap than the base region.

10. A method of forming a lateral bipolar junction transistor (LBJT) comprising:
providing a type III-V semiconductor material that is present on a nucleation dielectric layer with a bonding method;
patterning the type III-V semiconductor base material selectively to the nucleation dielectric layer to form a base region;
forming emitter and collector extension regions on opposing sides of the base region; and
forming an emitter region and collector region on exposed portions of the nucleation dielectric layer extending into contact with the emitter and collector extension regions.

11. The method of claim 10, wherein said providing the type III-V semiconductor material on the nucleation dielectric layer with the bonding method comprises:
forming a first material stack comprising said nucleation dielectric layer, wherein the second material stack further comprises a buried oxide region separating the nucleation dielectric layer from a supporting substrate;
forming a second material stack comprising a passivating layer on said type III-V semiconductor material on said passivating layer, wherein the first material stack further comprises a sacrificial oxide layer separating said III-V semiconductor material from a handling substrate;
bonding the first material stack to the second material stack through contact between the nucleation dielectric layer and the passivating layer; and
removing the handling substrate and the sacrificial oxide layer.

12. The method of claim 10, further comprising:
forming an extrinsic base material layer comprising a doped polycrystalline silicon material, doped polycrystalline germanium containing material or a doped single crystalline germanium containing material on a germanium containing semiconductor base material;
forming a hard mask on the extrinsic base material layer;
etching the extrinsic base material layer selective to the hard mask and the germanium containing semiconductor base material to pattern an extrinsic base region;
forming a spacer on the sidewalls of said extrinsic base region; and
etching the germanium containing semiconductor base material to pattern the base region with an etch that is selective to the hard mask and the spacer prior to said forming emitter and collector extension regions.

13. The method of claim 12, wherein said forming emitter and collector extension regions comprises performing an angled ion implantation to produce an emitter and collector junction on opposing sides of the base region.

14. The method of claim 13, wherein the emitter region and collector region comprise polycrystalline material that is grown on the nucleation dielectric layer.

15. The method of claim 13, wherein the emitter region and collector region comprise single crystalline semiconductor material that is grown on the nucleation dielectric layer.

16. The method of claim 13, wherein the nucleation dielectric layer is selected from the group consisting of cerium oxide ($CeO_2$), lanthanum oxide ($La_2O_3$), yttrium oxide ($Y_2O_3$), gadolinium oxide ($Gd_2O_3$), europium oxide ($Eu_2O_3$), terbium oxide ($Tb_2O_3$), doped silicon nitride and combinations thereof.

17. The method of claim 13, wherein the nucleation dielectric layer comprises silicon including implanted silicon to include nucleation sites.

18. The method of claim 13, wherein the nucleation dielectric layer comprises silicon oxide including implanted silicon to include nucleation sites.

19. The method of claim 13, wherein the emitter region comprises semiconductor material having a larger band gap than the base region.

20. The method of claim 13, wherein the collector region comprise semiconductor material having a larger band gap than the base region.

* * * * *